(12) United States Patent
Weinraub

(10) Patent No.: US 7,348,797 B2
(45) Date of Patent: Mar. 25, 2008

(54) FUNCTIONAL CELLS FOR AUTOMATED I/O TIMING CHARACTERIZATION OF AN INTEGRATED CIRCUIT

(75) Inventor: Chananiel Weinraub, Herzliya (IL)

(73) Assignee: Texas Instruments Incorporated, Dallas, TX (US)

( * ) Notice: Subject to any disclaimer, the term of this patent is extended or adjusted under 35 U.S.C. 154(b) by 170 days.

(21) Appl. No.: 11/215,433

(22) Filed: Aug. 30, 2005

(65) Prior Publication Data

US 2007/0050737 A1 Mar. 1, 2007

(51) Int. Cl.
*G06F 7/38* (2006.01)
*H03K 19/177* (2006.01)

(52) U.S. Cl. .......................... 326/40; 326/93

(58) Field of Classification Search ............ 326/37–41, 326/93, 47; 713/375, 400
See application file for complete search history.

(56) References Cited

U.S. PATENT DOCUMENTS

| | | | |
|---|---|---|---|
| 5,649,176 A * | 7/1997 | Selvidge et al. | ............ 713/400 |
| 6,266,801 B1 | 7/2001 | Jin | |
| 6,446,230 B1 * | 9/2002 | Chung | ........................ 714/726 |
| 6,658,632 B1 * | 12/2003 | Parulkar et al. | ................ 716/4 |
| 2007/0050737 A1 * | 3/2007 | Weinraub | ....................... 716/4 |

* cited by examiner

*Primary Examiner*—James Cho
*Assistant Examiner*—Jason Crawford
(74) *Attorney, Agent, or Firm*—Steven A. Shaw; W. James Brady; Frederick J. Telecky, Jr.

(57) ABSTRACT

Hardware cells inside of an IC device, such as in a processor circuit, for characterization that replace functional flip-flops that capture inputs or drive outputs in the device. The cells are circuits that are used, in conjunction with a software method, to generate test programs for testing exact I/O transitions for timing measurements at various operating conditions.

2 Claims, 12 Drawing Sheets

FUNCTIONAL CELLS FOR AUTOMATED I/O TIMING CHARACTERIZATION OF AN INTEGRATED CIRCUIT

CROSS-REFERENCE TO RELATED APPLICATIONS

None

FIELD OF THE INVENTION

The present invention relates to hardware cell additions to an Integrated Circuit (IC) device for characterization that verifies the I/O timing of the device on all split lot materials and operating conditions.

BACKGROUND OF THE INVENTION

The Functional testing of any device, digital or analog, includes the steps of functional verification and characterization. In the design of a new integrated circuit (IC) such as a computer processor, functional characterization is performed on Primary Input and Output logic in the chip itself in order to verify the timing. Modern, complex IC devices are designed to contain one or more embedded core data processors for processing digital signals such as computer instructions from internal or external software. The core is operatively communicates with memory, peripherals, and other circuitry in the IC. An embedded core of an IC also has many input and output terminals, many of which are not directly accessible by the external pins of the IC. Thus, there is no direct access to these I/Os for characterization and testing.

Two types of tests, scan vector test and application vector test, are used to verify function parameters of a device. The scan vector test, also called a structural test, used in scan chain and boundary scan configurations, is used to search for defects and verify logical or physical failures within a circuit. Application vector testing is used to verify that a circuit is functional, the circuit is correctly controlled by primary inputs, and that the expected protocols and behaviors are observed in the primary outputs and primary inputs. When an IC is designed, the logic paths and functions are characterized according to design protocols to make sure the chip works correctly. Vector patterns are used to send instructions into the chip's inputs in order to create outputs.

Logic that is built into a an integrated circuit (IC) in order to facilitate characterization and testing of the chip is called "Design for Test" (DFT). DFTs for functional testing are a necessary step to perform on a new processor design to insure that the logical functions designed in the processor perform properly. Characterization determines timings of the device to define exactly the way the actual manufactured device works. Characterization is verifying the input/output (I/O) timing of the IC on all split lot materials and operating conditions. Usually characterization is performed, by using complex functional tests of the device. DFT logic facilitates this process.

FIG. 1 illustrates a simplified circuit diagram containing sequential logic elements connected to logic blocks. Each logic element is a flip-flop ("FF"), which is a logic circuit that can hold one bit of memory with data input and output. The output is driven by a clock, and the output changes in synchronization with the clock cycle. Each D-type flip-flop has a single input in addition to a clock and stores a single bit of data, either a zero (0) or a one (1). For example, a D flip-flop will transfer data from a D input to Q output pin on the rising edge of the clock (rising edge triggered FF). A set of D flip-flops operably connected by data input and outputs all run with a common clock or different clocks. In circuit 10, inputs 12 comprises input data according to the data sheet that is transmitted to logic block 14. The data passes through FFs 16 before being inputted into logic block 18. Data from logic block 18 the pass through FFs 20 and third logic block 22 before being output at 24.

An inherent problem with convention methods for characterization is that up to thousands of I/Os must be characterized in an integrated circuit. In prior methods, characterization of a device was performed using very complex functional test vectors that were generated by design engineers. The functional test vectors create exact I/O transitions for timing measurements at all process corners and operating conditions, such as voltages and temperatures. Further, test engineers must create millions of complex and long functional test vectors, in order to generate the required protocol transitions at the I/Os of the IC, expending months worth of time de-bugging and operating the vectors, which can cause significant time delays to bring a new IC device to market.

SUMMARY OF THE INVENTION

The disadvantages of the prior characterization hardware and methods are overcome with preferred and alternative exemplary embodiments of the present invention that relate to hardware "cells" that a hardware designer uses to replace the traditional functional flip-flops in an IC device that capture inputs or drive outputs. The input and output characterization cells of the present invention are used for the characterization phase of testing an IC. The data sheet for a new processor design provides the timing relationships or the patterns of waveforms of the behaviors of the protocols for each I/O, and each IC may have numerous input and output specifications that must be verified prior to mass production of the IC.

The present invention includes a hardware addition inside the device or processor and external software that a test engineer can use to automatically generate a test program using the hardware addition. The associated software methods that efficiently generate test-programs for testing a required Input/Output (I/O) timing in the processor using the preferred characterization cells. The present invention can reduce the characterization time for a new processor design from months and years of an engineering team down to weeks of time from a single engineer.

BRIEF DESCRIPTION OF THE DRAWINGS

For a better understanding of the nature of the present invention, its features and advantages, the subsequent detailed description is presented in connection with accompanying drawings in which.

DETAILED DESCRIPTION OF THE INVENTION

The exemplary embodiments for functional cells include hardware and methods used for characterization of a processing device, such as an integrated circuit (IC). An embedded core of an IC contains or is connected to many input and output (I/O) terminals. Characterization of an IC requires testing and verifying required I/O timing compliance by creating exact I/O transitions for timing measurements at various temperature and voltage conditions on each I/O of the IC.

Figure 1:
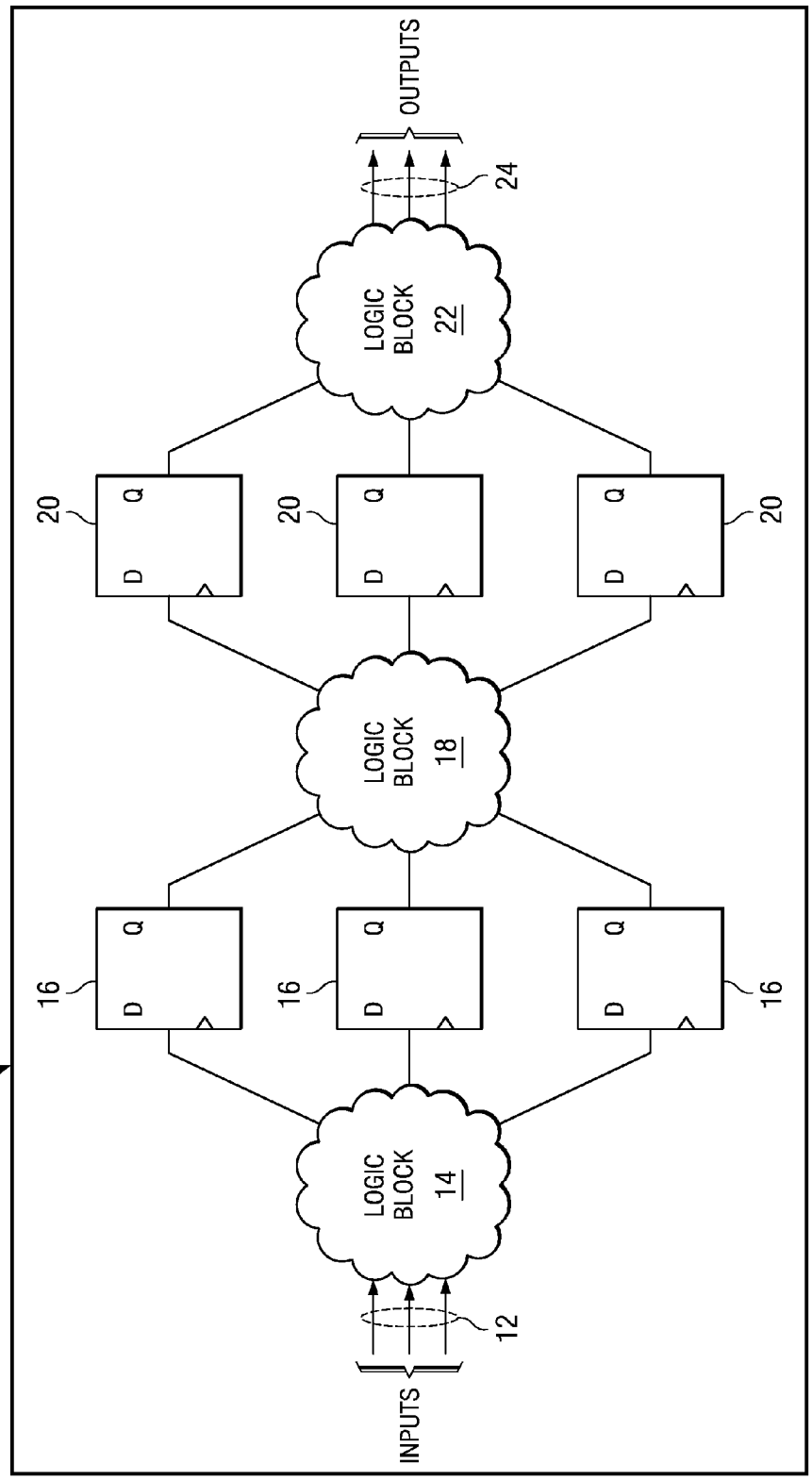
FIG. 1 is a diagram of an IC device having multiple logic blocks and sequential input and output logic elements of the prior art.
Figure 2:
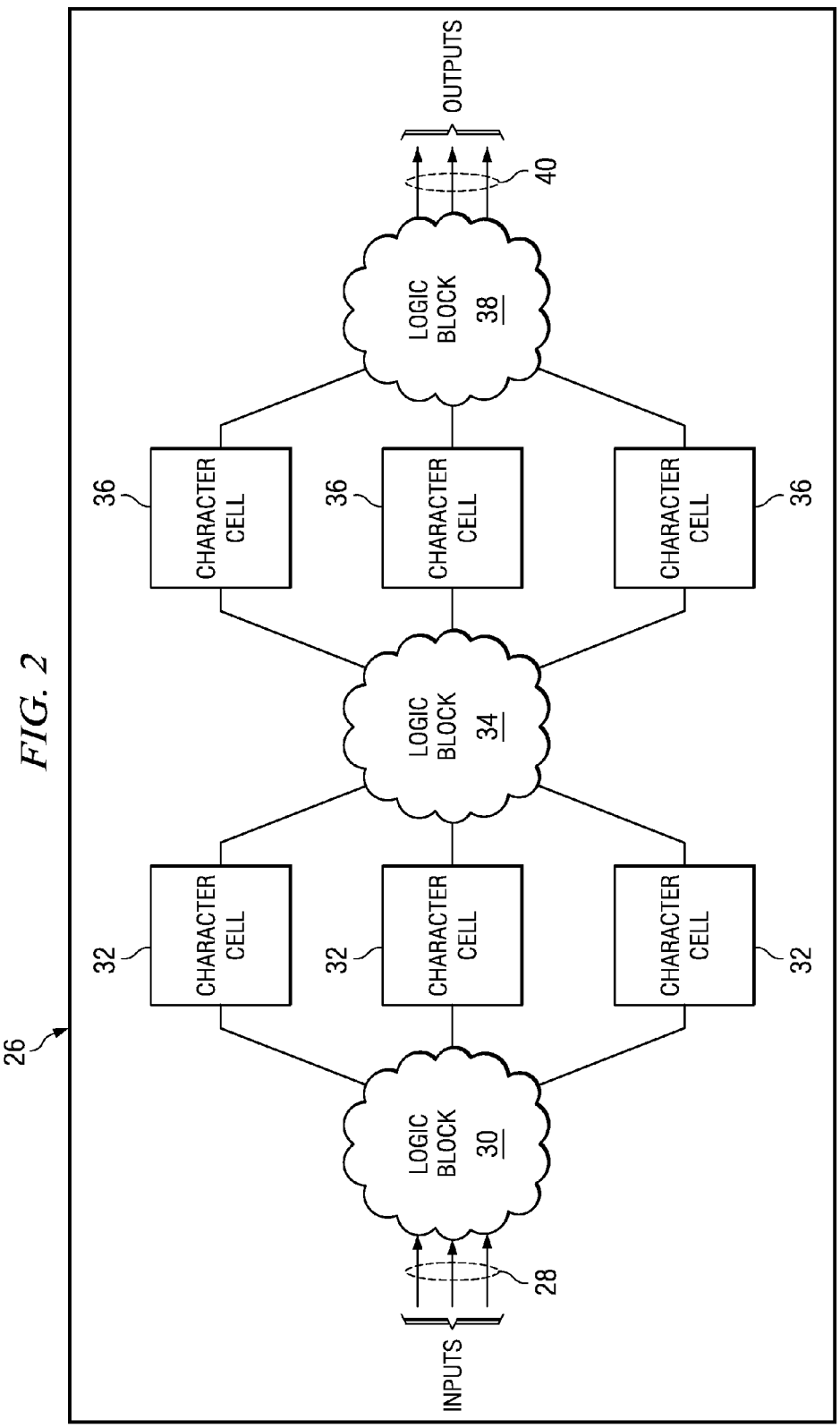
FIG. 2 is a diagram of the processor where the sequential logic elements have been replaced with input and output characterization cells of the preferred and alternative embodiments.

To illustrate the general features of the exemplary embodiment, FIG. 2 provides a simplified IC diagram of boundary logic that is similar to the diagram in FIG. 1. Processing device 26 has inputs 28 that pass through logic blocks 30,. However, the first functional flop 16 in processing device 10, that samples an input, has been replaced in IC 26 with input characterization cells 32. Additionally, the last functional flops 20 in device 10, that drive an output, are replaced with output characterization cells 36. Each characterization cell in the input 32 and output 36 group of cells includes the same original functional FF it is replacing (e.g. FF 16 and FF 20, respectively) together with additional FFs or circuitry that will not interfere with I/O timing or the clock of the FFs. In an IC, all of the internal boundary functional flops could be replaced by the exemplary characterization cells. Usually only the First FF that sample a primary input, and the Last FF that drives a Primary Output, needs to be replaced by the Characterization Cells. The plurality of input and output characterization cells are sampling and driving the I/Os for characterization.

If several FFs are driving a single output with some type of combinational cloud, then the preferred software will identify the FFs and provide the test engineer a list to choose the FF in which to create a condition in order to measure its timing. Using the present invention, the operator or test engineer can use a specification data sheet for the IC design with the preferred software to create a pattern automatically for the tester to drive the IC using the exemplary characterization cells that have replaced the functional boundary FFs. In the IC, the tester creates all the transitions that are required for all the timing measurements of the IC.

The characterization cell will generate a timing transition rise or fall or a repetitive signal at the output for measuring Outputs timing+Inputs setup and hold of all the I/Os of the IC. After the transition is generated by an Output Characterization cell, the signal can be tested and measured in any manner desired in order to test the Output timing. The characterization cells generate the transition within the IC itself, instead of using functional vectors, to verify certain timings or transitions from a data sheet. The characterization cells correspond to functional vectors so that a transition can be generated in the device in the exact I/O desired. The characterization cells provide controllability and observability with every internal functional boundary FF in an IC. A shift register is created with logic elements (E.g. flip-flops) in the characterization cells that are connected with a common shift clock. By using the shift register, the test engineer can create any transition on any output that is desired or capture any change of input that is desired.

Figure 3:
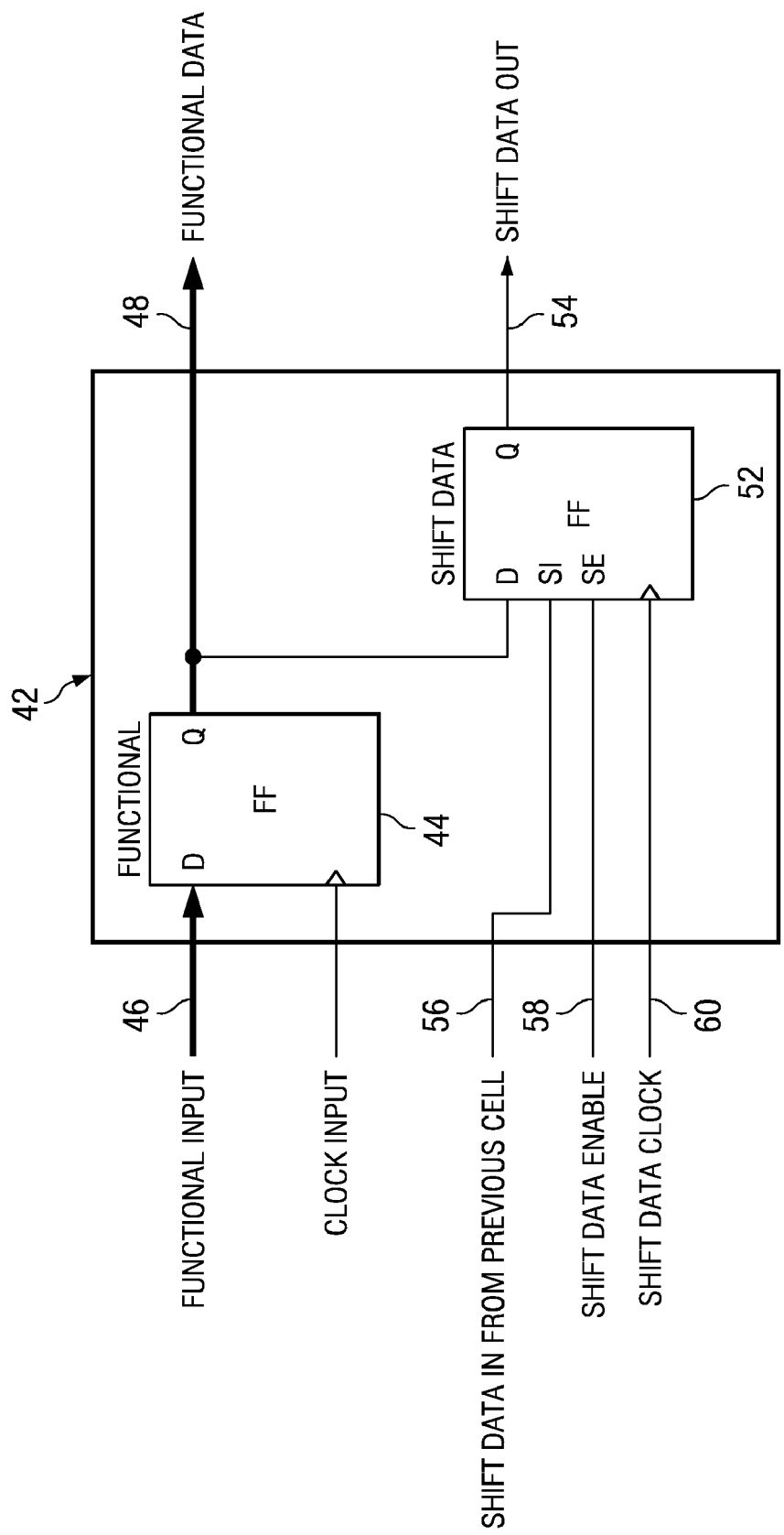
FIG. 3 is a circuit diagram illustrating an input characterization cell driven by an external clock.

FIG. 3 illustrates a circuit diagram of a preferred exemplary input characterization cell 42 that contains two circuit elements. Cell 42 that replaces an input FF, such an input FF 16 described previously in FIG. 1, that is operating on an external clock source 50. The D type flip-flop 44 is a functional flop that receives a functional input 46 and outputs functional data 48. Cell 42 contains one additional D flip-flop, Shift FF 52 for capturing the functional data 48. Shift FF 52 is connected to other boundary input characterization cells (not shown) as part of a shift register on a common Shift Data Clock 60 and receives data input from a previous shift cell on Shift Data In 56 to the serial in (SI) pin of FF 52. Control input for controlling the cell 52 from internal or external controller is through Shift Data Enable connection 58 into the shift enable (SE) pin on FF 52. Shift FF 52 transmits data bits out through Shift Data Out 54, which becomes the shifted input of a subsequent input cell in the shift register.

Since exemplary characterization cell 42 does not capture a falling-edge of external clock 50, the cell 42 does not capture functional input 46 in real-time. The shift FF 52 captures functional data at any feasible time period desired after functional FF 44 captures functional input data 46 by the rising edge of the clock input 50.

Figure 4:
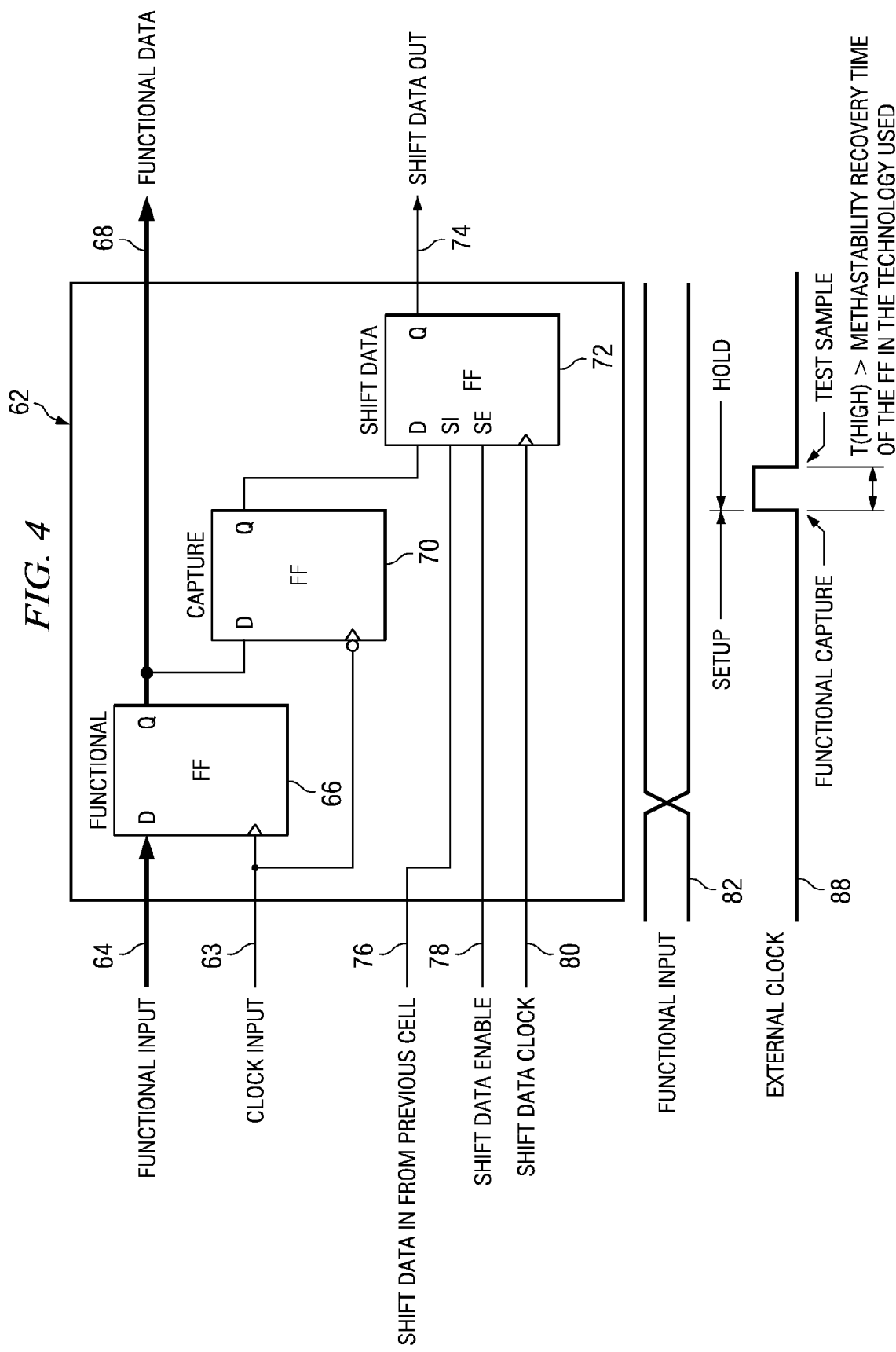
FIG. 4 is a circuit diagram illustrating an input characterization cell driven by an external clock that performs real-time functional data capture.

FIG. 4 illustrates a circuit diagram of an alternative exemplary input characterization cell 62 that is operating on an external clock source 63. Cell 62 is similar to cell 42 in FIG. 3 but with an additional circuit memory element 70. The FF 66 is a functional flop that receives functional input data 64 and outputs functional data 68. Input cell 62 contains two additional D-type FFs, a Capture FF 70, for capturing the functional data 68 on the falling-edge transition of the external clock 66, and a Shift FF 72 for capturing the data from FF 70 and shift it out. Shift FF 72 is connected to other boundary input characterization cells (not shown) as part of a shift register on a common Shift Data Clock 80 and receives data input from a previous shift cell on Shift Data In 76 to the serial in (SI) pin of FF 72. Control signal input for the shift register is through Shift Data Enable connection 78 into the shift enable (SE) pin on FF 72. Shift FF 72 transmits data bits out through Shift Data Out 74, which becomes the shifted input of a subsequent input boundary cell in an IC.

The accompanying timing diagrams in FIG. 4 show functional input in time 82 and a corresponding external clock signal 88. The shifted functional input 64 is received into FF 66 in order to measure setup and hold on the rising edge of the external clock input 63. The "setup time" is the time a data signal must remain stable prior to the clock edge.

The "hold time" is the time the same data signal must remain stable after the clock edge. Setup and hold times are defined for each Primary Input of the IC such that functional input data must be stable in the setup and hold time window. Functional input 64 arrives at cell 62 prior to the rising edge of the external clock 63 as shown in time-line diagrams 82 and 88. Characterization cell 62 provides real-time capture because Capture FF 70 captures the functional data 68 on the falling edge of the external clock 63. Falling-edge capture FF 70 enables the analysis of the functional FF 66 settling time in case of metastability. The time T of the pulse width of external clock 63 must be greater than the metastable recovery time of the FF in the technology used.

The metastable recovery time is a state of a functional FF that has entered an uncertainty state when input data changes in a forbidden window around the rising edge of the clock. If the data changes together with the rising edge of the clock, it may cause FF 66 to enter a metastable state. Once a FF is in a metastable state, the data is neither a logic zero nor a logic one and the voltage could jump to either logic value or oscillate in between, causing errors in the unstable FF and downstream FFs to occur. The falling edge Capture FF 70 captures data after the functional FF 66 captures functional input data on the rising edge of the clock input. By adding a Capture FF 70 to control the capturing of functional data at the falling edge of a clock input, the pulse width of the clock input can be changed so that the test engineer will know whether the correct data was captured at the falling edge and that functional FF 66 did not enter into a metastable state.

Figure 5:
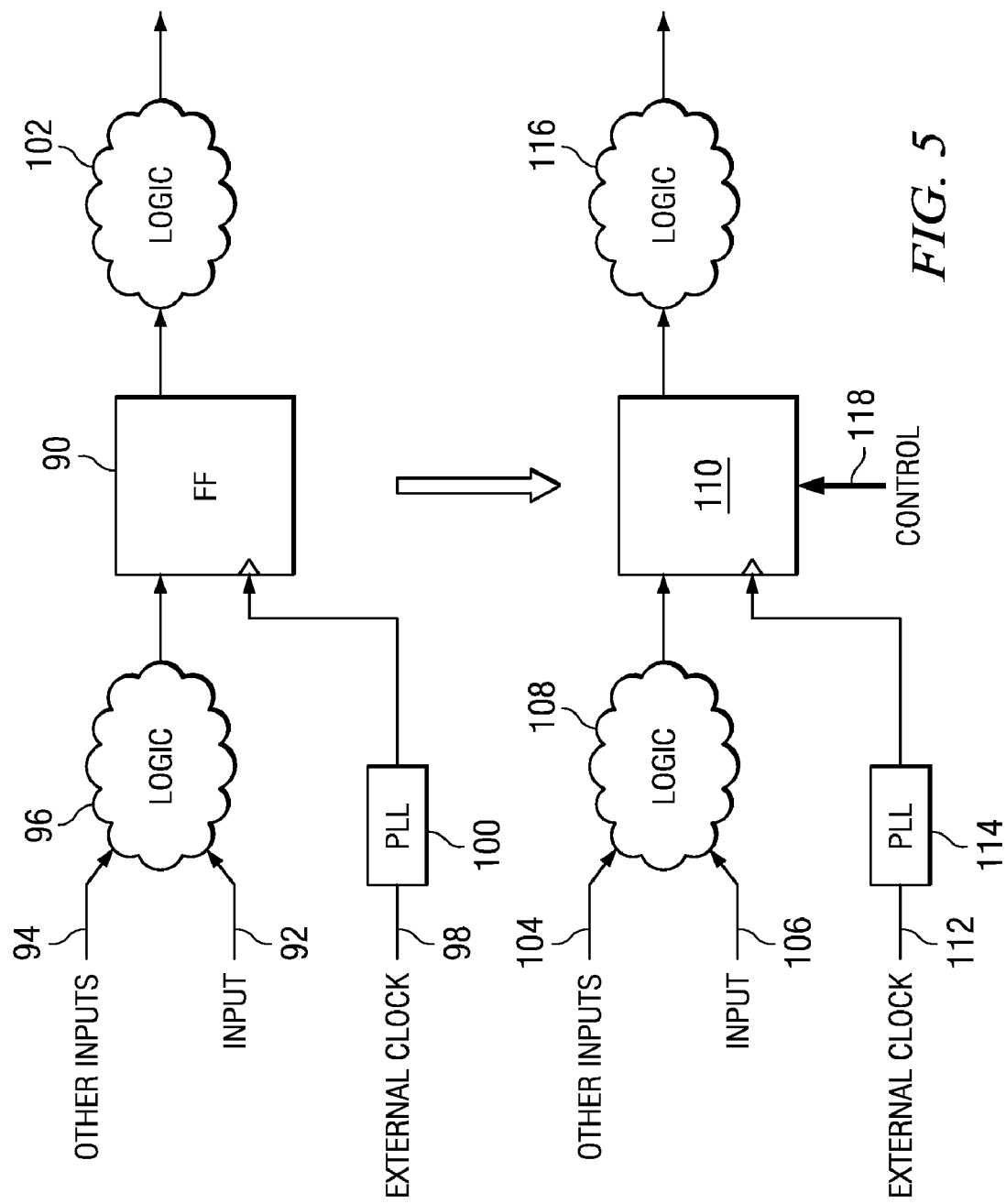
FIG. 5 is a flow diagram illustrating replacement of an input functional logic element with an input characterization cell driven by an internal PLL (multiplying, or non-multiplying Phase-locked loop)

FIG. 5 contains two simplified circuit diagrams that illustrate how an additional exemplary input characterization cell 110 replaces an input functional flip-flop 90 that is clocked by an internal multiplying or non-multiplying Phase-Locked Loop (PLL) in an IC. Functional FF 90 is the first functional FF sampling the functional input 92 or other inputs 94 from logic block 96 transmits the sampled functional data out to logic block 102. Functional FF 90 operates on internal clock from PLL 100 that either multiplies or does not-multiply (for phase shift compensation) cycles from external clock 98. In this circuit, to measure setup and hold times of the Inputs, relative to the external clock, the input transitions that are sampled by the PLL 100 relative to the external clock 98 must be sampled on the internal rising edge exactly at the same position of the external clock and not on a different rising edge of the PLL signal.

In the circuit diagram below the flow arrow in FIG. 5, input characterization cell 110, which contains a similar functional flop with additional circuitry, replaces functional FF 90. The input cell 110 receives functional data input 106 or other inputs 104 from first logic block 108 and outputs functional data to logic block 116. Internal PLL 114 receives clock signals from external clock 112 and multiplies external clock signals at $F_{pll}=n*F_{in}$, where n is a whole number such as n=1, 2, 3, 4, etc. Input cell 110 also receives control signals 118 from internal or external controller (not shown) to control the characterization test performed by cell 110. Further details of the exemplary input cell 110 circuitry are illustrated in FIG. 6.

Figure 6A:
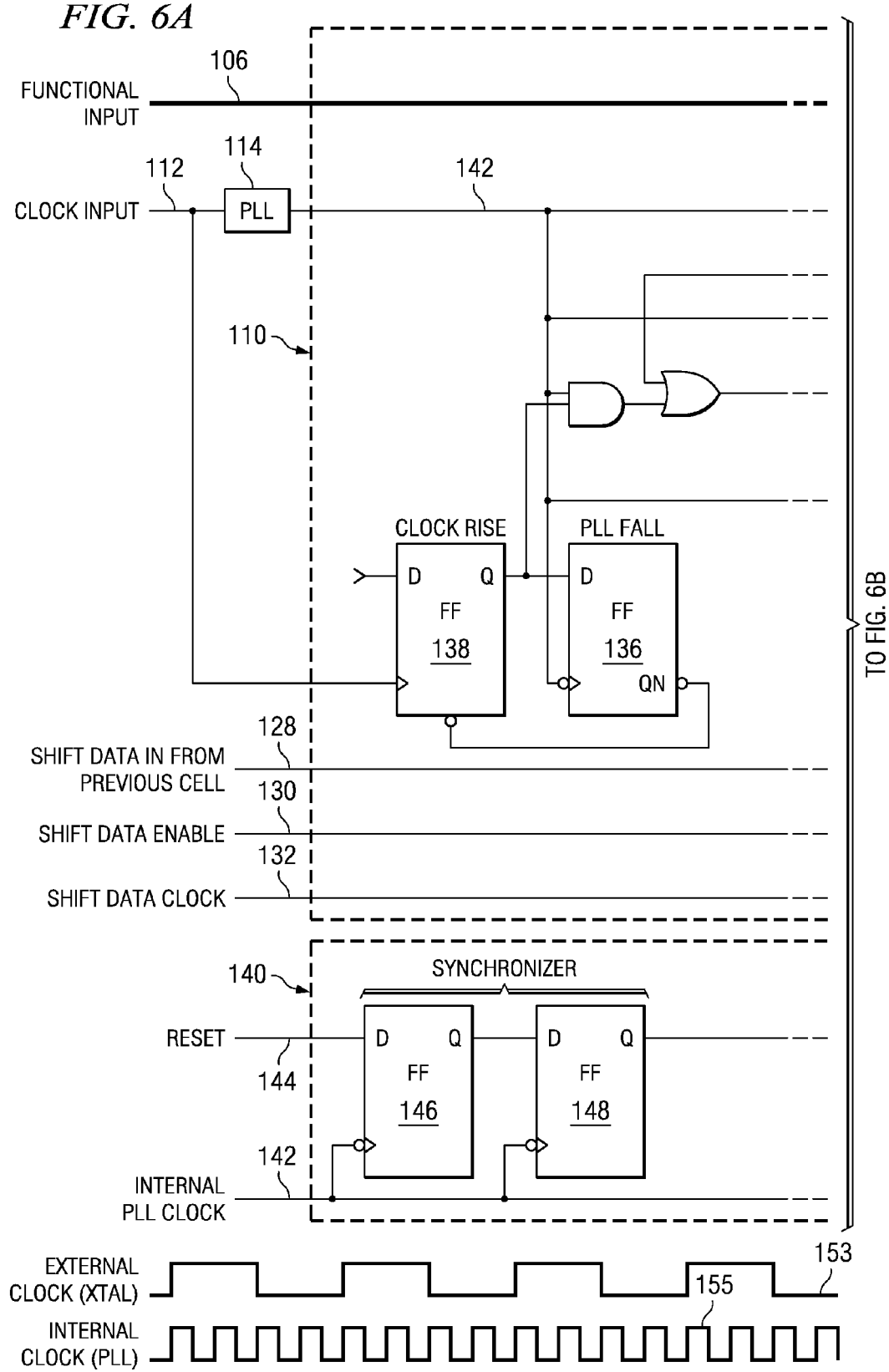
FIG. 6 is a circuit diagram of the input characterization cell driven by an internal multiplying PLL illustrated in FIG. 5.
Figure 6B:
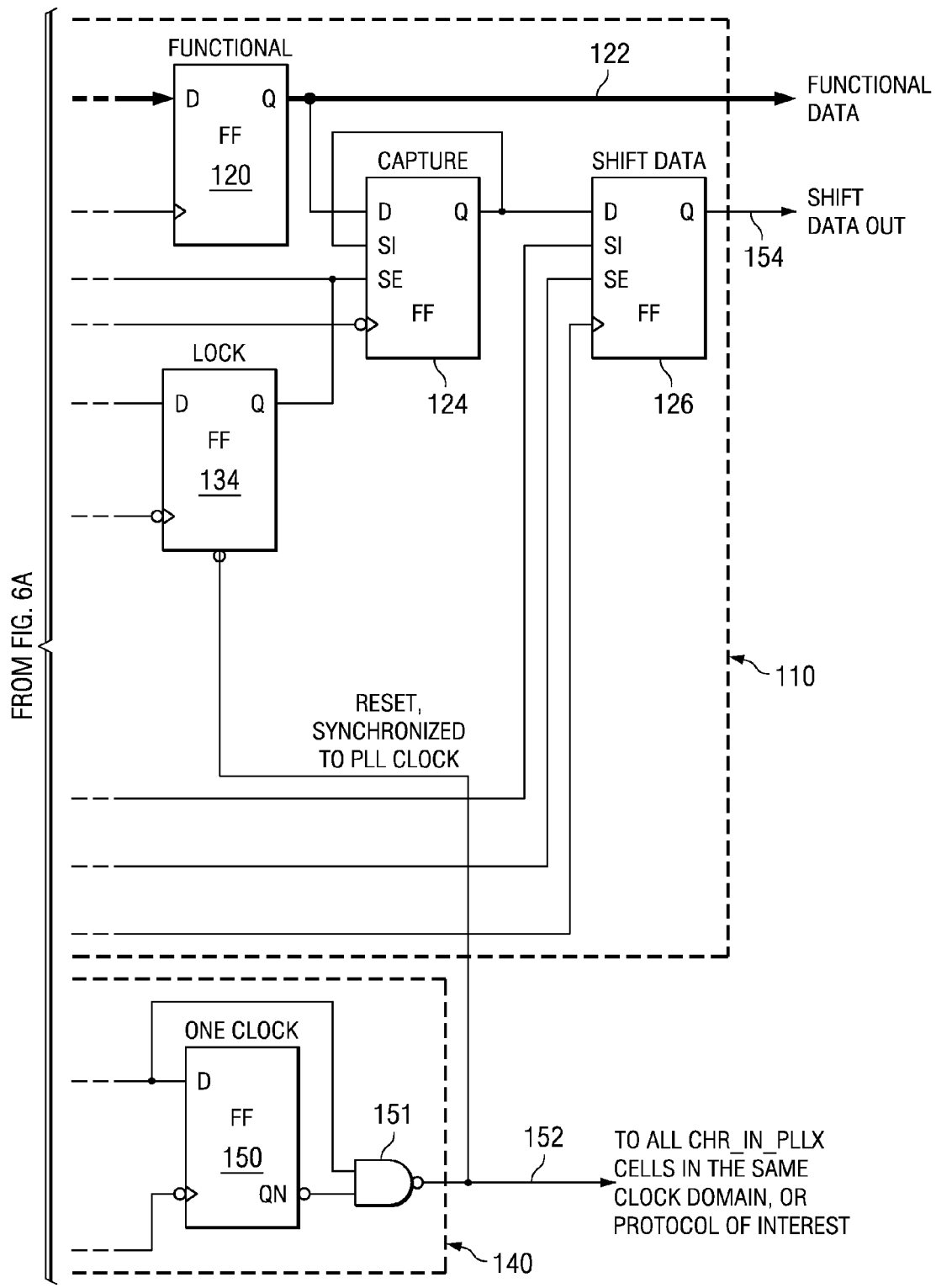

In FIG. 6, an alternative embodiment is an input characterization cell 110 that includes seven primary circuit elements, six FFs and a synchronizer. Functional FF 120 receives functional data input 106 and outputs functional data 122. Functional FF 120 receives clock signals from PLL 114 that multiplies external clock 112. Cell 110 contains additional D type FFs, Capture FF 124 for capturing the functional data 122 at the falling-edge transition of clock 142 and a Shift FF 126 for capturing the data from FF 124 and shift it out. Shift FF 126 is connected to other input boundary characterization cells (not shown) as part of a shift register on a common Shift Data Clock 132 and receives data input from a previous shift cell on Shift Data In 128 to the SI pin of FF 126. Control input for the shift register is through Shift Data Enable connection 130 into the SE pin on FF 126. Shift FF 126 transmits data bits out through Shift Data Out 154, which becomes the shifted input of a subsequent input cell in the shift register.

In the waveforms diagrams shown below characterization cell 110 in FIG. 6, the first diagram 153 is an External Clock (e.g. XTAL) signal representation from external clock 112. Diagram 155 is an Internal Clock (PLL) signal representation of internal clock signal 142 driven by PLL 114. When measuring timings of setup and hold for external clock 112, the transition being formed by the multiplied internal clock signal 142 from PLL 114 should be sampled at the rising edge of the PLL clock 142 that corresponds exactly to the rising edge of the external clock signal 112 but not on a different rising edge of the multiplied PLL signal 142. This is to ensure that the sampling of the PLL clock signal 142 reflects a real setup and hold of the external clock signal 112. The input functional data signal 106 will arrive at the device being tested in time before the rising edge of the external clock 112 because the data must be stabilized. This data 106 is sampled internally by functional FF 120 that is operating on the internal PLL clock, and therefore the functional FF 120 must capture the data on the same rising edge that corresponds exactly to the external clock's rising edge and not a different PLL clock cycle.

Characterization cell 110 captures functional data 106 of one functional cycle in which the PLL clock 142 rises together with the external clock 112. In order to ensure the capture of the correct rising edge of the PLL clock cycle that corresponds to a rising edge of the external clock cycle, characterization cell 110 is designed to contain additional circuitry and functional flops Lock FF 134, Clock FF 138, and PLL Fall FF 136. Clock FF 138 receives a clock input directly from external clock 112 and PLL Fall FF 136 receives a clock input from PLL 114 clock signal 142. PLL Fall FF 136 outputs data on the falling edge of the PLL clock signal in order to reset the Clock FF 138 that is set on the rising edge of the external clock signal and input into the Lock FF 34. Lock FF is also operably connected to synchronizer 140. Lock FF 34 will sample a high logic value '1' only after both the internal clock 142 AND external clock 112 risen, and then will lock on that value. This lock signal will set the SE input of FF 124 to lock on the last value captured on the falling edge of clock 142. Then the Shift FF 126 can be used to sample and shift the value from FF 124.

The purpose of synchronizing clock signals from two different clock domains is to protect the downstream logic in the circuit or device in case the first FF in the new clock domain enters a metastable state. Synchronizer 140 receives clock signals from the internal PLL clock 114 (shown at line 142) into each internal flop and can receive data in reset/data line 144. The reset from the Synchronizer 140 is synchronized to the PLL 114.

Synchronizer 140 is based on a level synchronizer design that uses FF 146 and FF 148 in series without any intervening combinatorial circuitry in order to have FF 146 exit a metastable state and have its output settle prior to sampling by FF 148. Synchronizer 140 is an edge-detecting type synchronizer circuit that adds FF 150 to the output of the synchronizer FFs 146, 148. The output of FF 150 is inverted and combined with an NAND gate 151 to the output of the synchronizer FF 148. This synchronizer configuration will reset the Lock FF 134 before the rising edge of the external clock. The output from synchronizer 140 is split between Lock FF 134 and a line 152 that transmits to other exemplary characterization cells in the device that are similar to cell 110 and have an internal PLL clock 114 and are in the same clock domain or protocol of interest. Since the synchronizer depth is 3, then for a PLL that is used for multiplying the external clock by less than 4 (e.g., 2, 3), the Synchronizer 140 should be replaced by a simple circuit operating on the external and/or internal clocks. For example: the second FF in the synchronizer 148 can be a Rising-edge triggered FF, thus it synchronizes in 1 cycle less.

Using the Clock FF 138, PLL Fall FF 136, and Lock FF 134, the characterization cell 110 can determine the rising edge of the internal clock 142 cycle that rises together with the external clock 112 .in order to sample functional input 106 at the correct timing. The Lock FF 134 locks on a high value ('1') right after the falling edge that the capture FF 124 captured the data from the Functional FF 120, and then the Shift FF 126 can capture and shift the data from the Capture FF 120 to a primary output for analysis. The design of exemplary characterization cell 110 assumes that the PLL 114 compensates for the Clock-Tree Insertion Delay (using PLL feedback from the end of the Clock-Tree).

Figure 7:
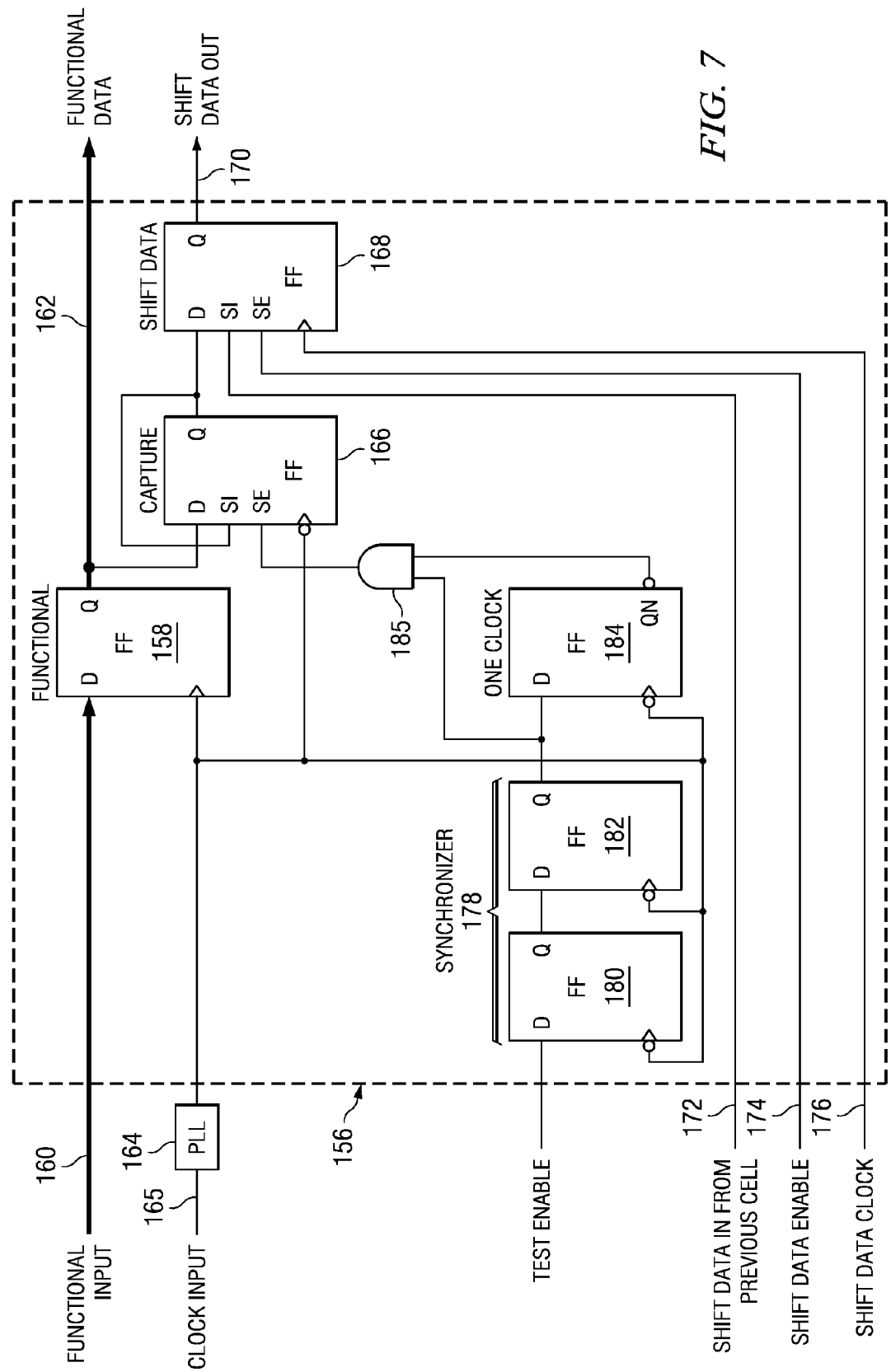
FIG. 7 a circuit diagram of the input characterization cell driven by an internal non-multiplying PLL.

FIG. 7 illustrates a circuit diagram of an alternative exemplary embodiment of input characterization cell 156 (for inputs that are sampled internally by FF that operates on clock from a non-multiplying PLL) that contains the same basic structure as cell 42 FIG. 3 with an additional two elements, a FF and a synchronizer. Characterization cell 156 operates on an internal non-multiplying clock run by PLL 164 that is synchronized to external clock 165, where $F_{pll}=F_{in}$. D-type FF 158 is a functional FF that receives a functional data input 160 and outputs functional data 162. Cell 156 contains a Capture FF 166, for capturing the functional data 162 on the falling-edge transition of an internal clock cycle, and a Shift FF 168 for capturing and shifting out the data from the capture FF 166. Shift FF 168 is also connected to other boundary input characterization cells (not shown) as part of a shift register on a common Shift Data Clock 176 and receives data input from a previous shift cell on Shift Data In 172 to the SI pin of FF 168. Control input for the shift register is through Shift Data Enable connection 174 into the SE pin on FF 168. Shift FF 168 transmits data bits out through Shift Data Out 170, which becomes the shifted input of a subsequent input cell in the shift register.

Finally, synchronizer 178 is made up of a first FF 180, second FF 182 and One Clock FF 184 serially connected with combined data output to the shift enabler of capture FF 166. Synchronizer 178 is based on a level synchronizer design that uses FF 180 and FF 182 in series without any intervening combinatorial circuitry in order to have FF 180 exit a metastable state and have its output settle prior to sampling by FF 182. This design ensures that the Test Enable input data is synchronized to the internal clock from PLL 164. Synchronizer 178 is an edge-detecting type synchronizer that adds FF 184 to the output of the synchronizer FFs 180 and 182. The output of FF 182 is inverted and combined with a NAND gate 185 to the output of the synchronizer FF 184. This synchronizer configuration will detect the rising edge of the internal clock signal from PLL 164 to synchronizer 178 and will generate a clockwide, active-high pulse. The signal from the NAND gate will enable the Capture FF 166 to sample the data from the Functional FF 158 for 1 internal cycle only.

Figure 8:
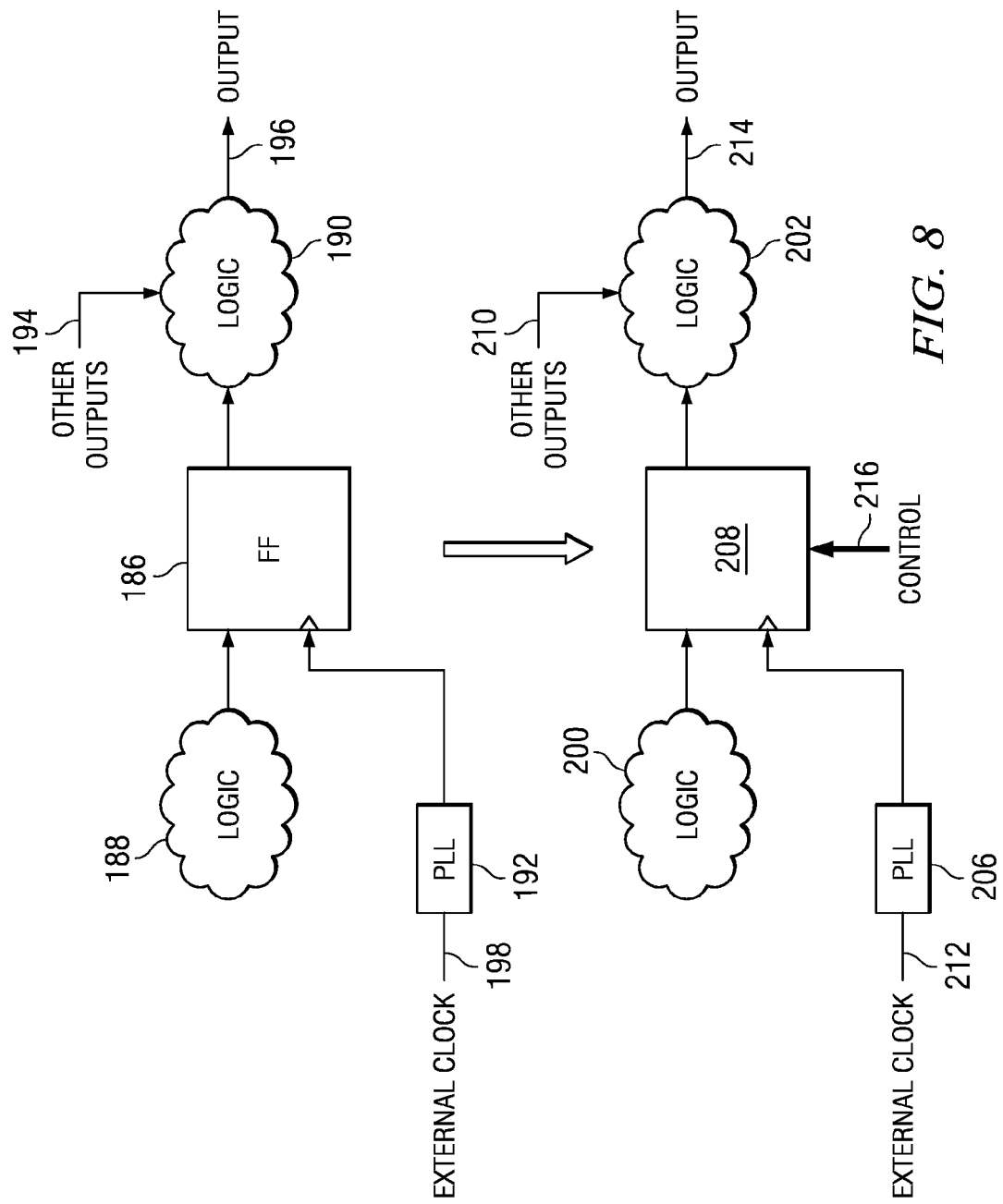
FIG. 8 is a flow diagram illustrating replacement of an output functional logic element with an output characterization cell driven by a internal PLL(multiplying, or non-multiplying)

FIG. 8 contains simplified circuit diagrams that illustrate how an alternative embodiment of an exemplary output characterization cell 208 replaces a last functional FF 186 in a device such as an IC processor. Output FF 186 samples functional data output from logic block 188 from the clock domain. Output FF 186 operates by an internal multiplying or non-multiplying Phase-Locked Loop (PLL) 192 clock domain that is synchronized to external clock 198. FF 186 outputs functional data to logic block 190, which can receive other outputs 194 as well. Logic block 190 transmits output 196 to a receiver that is external to the IC or device under test.

Alternative exemplary characterization cell 208, below the transition arrow in FIG. 8, is connected in a circuit of similar design to the circuit containing FF 186. Output cell 208 is a last characterization cell sampling the output from logic block 200 in the clock domain and is clocked by a multiplying or non-multiplying PLL 206 from external clock 212. Functional data output from characterization cell 208 is transmitted to logic block 202 that can also receive other outputs 210. Logic block 202 transmits output 214 to a receiver that is external to the IC or device under test. This circuit is used to measure time delay between IC outputs of clock to output timing of an output. Further, output characterization cell receives a control signal 216 from an external hard or soft controller (not shown) in order to control the timing measurement tasks performed by the output cell 208.

Figure 9A:
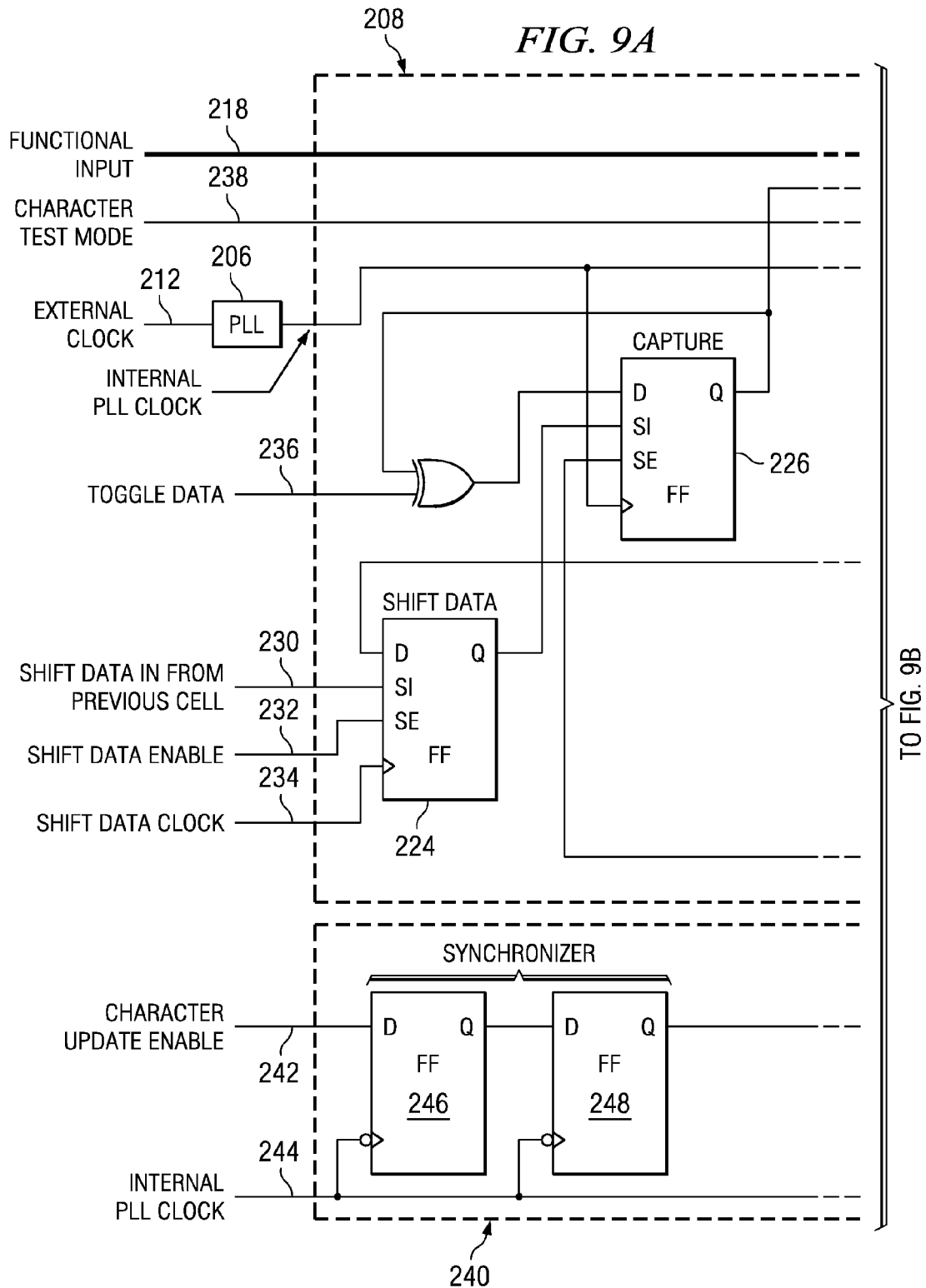
FIG. 9 is a circuit diagram of the output characterization cell illustrated in FIG. 8.
Figure 9B:
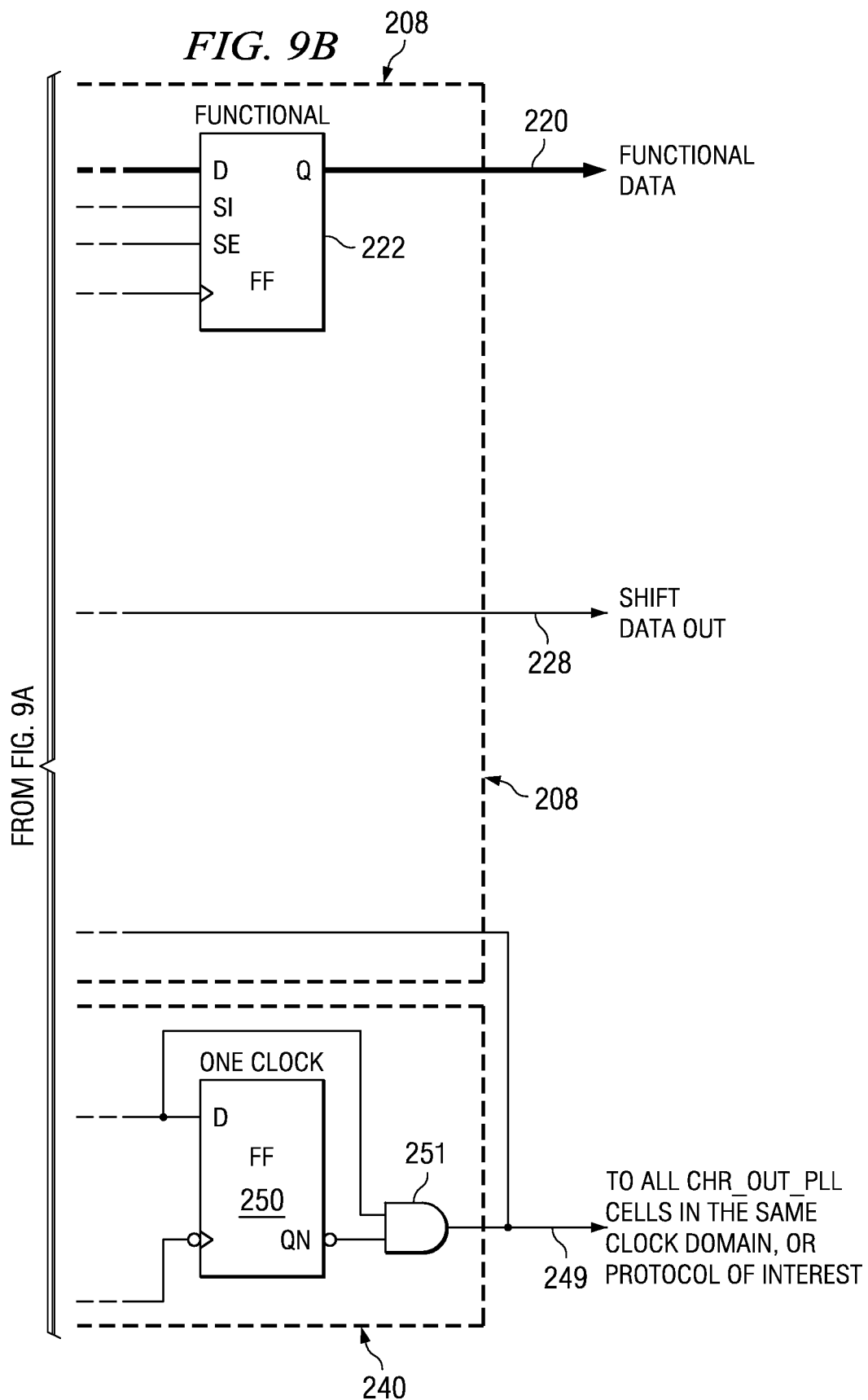

FIG. 9 illustrates a circuit diagram of the alternative output characterization cell 208 that contains four primary circuit elements, three FFs and a synchronizer. Cell 208 operates in a clock domain of internal multiplying or non-multiplying PLL clock 206 synchronized to external clock 212, where $F_{pll}$=any Frequency. The D-type FF 222 is a functional flop that receives functional data input 218 and outputs functional data 220 to logic block 202. Exemplary output cell 208 contains two additional D type flip-flops, a Capture FF 226 for capturing the data from Shift FF 224 for driving the required transition through the Functional FF 222. Shift FF 224 is connected to other boundary characterization cells (not shown) as part of a shift register on a common Shift Data Clock 234 and receives data input from a previous shift cell on Shift Data In 230 to the SI pin of FF 224. Control input for the shift register is through Shift Data Enable connection 232 into the SE pin on FF 224. Shift FF 224 transmits data bits out through Shift Data Out 228, which becomes the shifted input of a subsequent input cell in the shift register. A toggle data control 236 is used for data input into capture FF 226 to enable the generation of continuous transition signals at the output (Q) in FF 226. This provides capability for toggling the Functional FF 222 for output timing measurements with other measuring equipment, even on a bench test. The Characterization output cell design also provides a characterization test mode as an input 238 to Functional FF 222.

In exemplary output cell 208, an edge-detecting synchronizer 240 is implemented, which is driven by internal PLL 206 (shown for purposes of illustration as clock input 244) and receives input on data line 242 including characterization update enabler data. Synchronizer 240 is based on the level synchronizer design of FF 246 and FF 248 serially connected without any intervening combinatorial circuitry, followed by FF 250 added to the output of the FFs 246 and 248. The output of FF 250 is inverted and combined in AND gate 251, after which it is split between the sample enabler of Capture FF 226 and other exemplary characterization cells 249 in the IC under test that are similar to cell 208 having an internal PLL clock and are in the same clock domain or protocol of interest.

Figure 10:
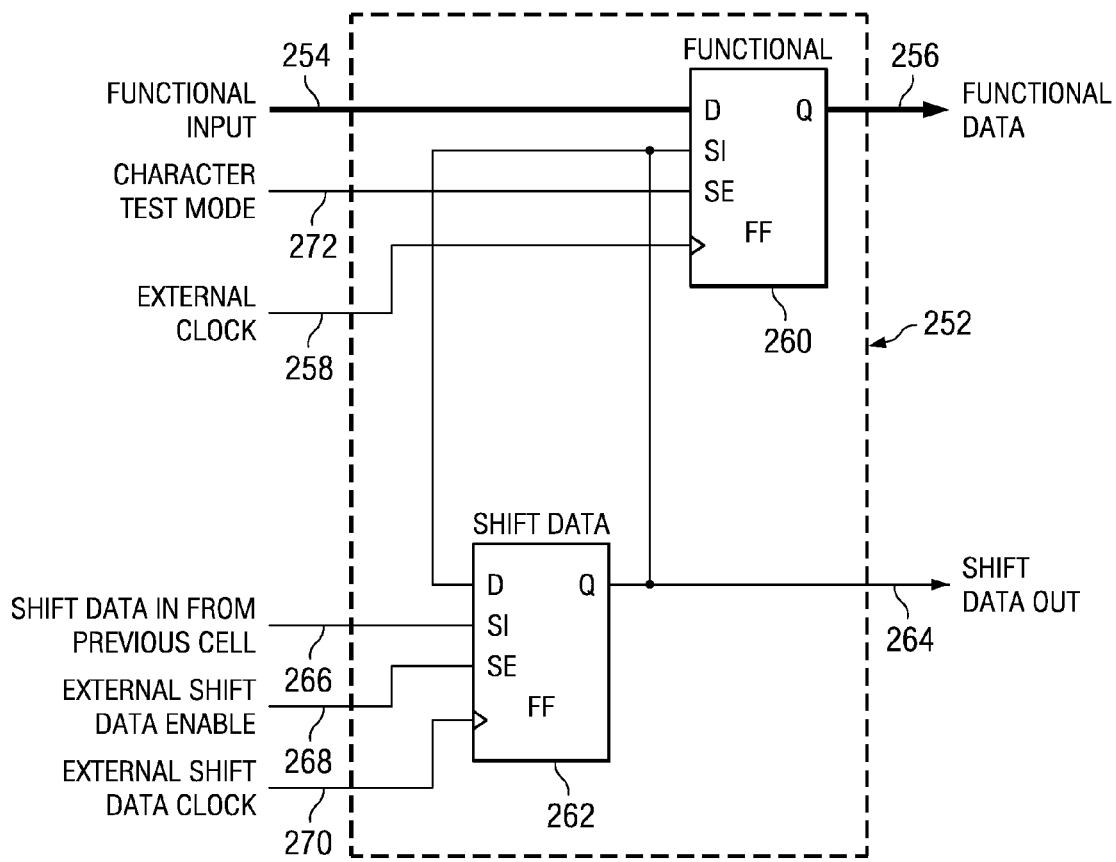
FIG. 10 is a circuit diagram of an output characterization cell driven by an external clock.

Referring to FIG. 10, an alternative exemplary output characterization cell 252 includes two circuit elements. Cell 252 operates in a clock domain of external clock 258. The D-type FF 260 is a functional flop that receives functional data input 254 and outputs functional data 256 to an output logic block, such as logic block 22 in FIG. 1. Cell 252 contains a Shift FF 262 for driving the required data to the Functional FF 260. Shift FF 262 is connected to other boundary output characterization cells (not shown) as part of a shift register on a common Shift Data Clock 270 and receives data input from a previous output cell on Shift Data In 266 to the SI pin of FF 262. Control input for the shift register is through Shift Data Enable connection 268 into the SE pin on FF 262. Shift FF 262 transmits data bits out through Shift Data Out 264, which becomes the shifted input of a subsequent input cell in the shift register. The Characterization Cell design 252 also provides a characterization test mode control 272 for the sample Enable pin in Functional FF 260.

Output characterization cell 252 is set into a Characterization test mode by input 272, and after setting the Shift FF 262 to the required value, the external clock 258 will rise in order to capture the data from the Shift FF 262 into the Functional FF 260, thus causing the required transition at the Functional Data output 256 which will propagate to the Primary output of the IC.

In the design of the shift register for input and output characterization cells operating on external clock only, the register chain of FFs in the register for output cells can be separated from the register chain of FFs for input cells. If the register chain and clock used for output characterization cells is separated from a register chain and clock that is used for input cells, then the Shift FF in the output cells using the exemplary output cell designs of the alternative embodiments may be a FF without a shift enable control. Further, if all exemplary output cells provide toggle data capability, then they may be used for an SSO (Simultaneously Switching Outputs) test of the outputs voltage drop.

For each new IC design, the protocol data sheet will provide a protocol list of the timing relationships or the patterns of waveforms of the behaviors of the IC's I/Os. In a lab, when a test engineer is ready to verify a protocol of a new IC chip design from a data sheet, he or she can run controller software on the gate level of the IC design, and the software will identify all of the drivers of the specific output in question or of concern. Using the software, characterization cells can be selected as particular sources to trigger the output or cause the transition desired. The software generates tests to generate the timing transitions in the FFs of the exact cell or cells of interest and automatically create a test program for the testing engineer. The testing engineer can then run the test program using the characterization cells and instantly verify the I/O timing and compare to the data sheet protocols.

Figure 11:
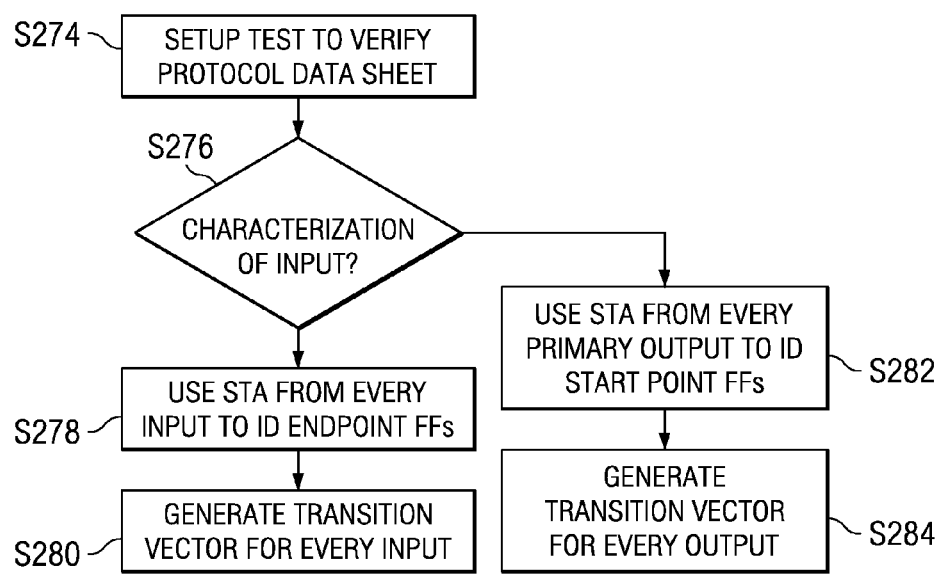
FIG. 11 is a flowchart of the method for generating transition vectors for performing timing measurements using the characterization cells of the present invention (Preferably the software will display a list of FF for selection by the user, and perform automatic insertion of the Characterization cells into the device).

FIG. 11 represents a flowchart used in an exemplary method for software that controls the generating and analysis of I/Os for characterization of ICs using the exemplary input and output cells of the present invention. To begin each input or output test, a protocol data sheet for the IC design must be referenced S274 in order to run characterization analysis on each I/O in the data sheet. If the characterization is to be performed on input cells in the processor in step S276, then the method proceeds in flowchart box S278 to use a Specific software or STA (Static-Timing-Analysis) for every Input in order to identify all of the end point FFs. Next, in step S280 the software generates a transition vector for every input as called-for in the data sheet. In this step S280, all other inputs should be set to a constant value that will not prevent the propagation of the transition to the tested FF. In a characterization for inputs, the tester transition time for inputs is set according to the functional frequency of the tested input.

If the characterization analysis is to be performed on outputs S267 and not input, then the process begins in step S282 by using a specific software or STA for every primary output to identify all of the start point FFs. Next, a transition vector is generated S284 for every output as called-for in the data sheet. In this step S284, all other output FFs are set to a constant value that will not prevent the propagation of the transition from the tested FF to the primary output. In an output characterization measuring a time difference between two or more signals, with any polarity rise/fall, the initial required value will be shifted in to all of the output characterization cells.

In an IC using the exemplary characterization cells, since most of the core is not part of the test, thus causing less internal IR drop, then to emulate functional core operation, there are two options. First, use BISTs (Built In Self Test) to exercise the core logic during characterization mode. Second, perform the tests with a lower core voltage by the calculated worst-case IR drop.

There are numerous advantages for using the characterization cells of the present invention. As stated previously, the time required for characterizing an IC design can be reduced from months by a team of test engineers down to weeks by a single test engineer. Further, the exemplary cells have no impact on clock delay since no gating is inserted into the circuitry. The cells do not cause data delay because there is no impact on the data path to the input FFs or from the output FFs.

One skilled in the art will appreciate that the present invention can be practiced by other than the described embodiments, which are presented for purposes of illustration and not limitation, and the present invention is limited only by the claims that follow.

What is claimed is:

1. An integrated circuit comprising:
   an embedded core, containing inputs and outputs, for processing digital signals;
   logic, operably connected to the embedded core; and
   a plurality of characterization cells, operably connected to the logic and the embedded core, wherein at least one characterization cell within the plurality of characterization cells comprises:
   a functional boundary flip-flop that is a first flip-flop sampling input from a clock domain having an input operatively connected to receive functional data and having an output that outputs the functional data;
   a capture flip-flop, having a data input operatively connected to the output of the functional boundary flip-flop, that captures a falling edge of a clock cycle;
   a shift flip-flop, having a data input operatively connected to the output of the capture flip-flop, and having a shift data input connected to a previous characterization cell in a shift register;
   a circuit element operatively connected to the capture flip-flop, that determines when the rising edge an internal multiplying clock is synchronized to a rising edge of an external clock; and a synchronizer, operatively connected to the internal clock, having output slip between the circuit element and another characterization cell in the plurality of characterization cells.

2. An integrated circuit comprising:
an embedded core, containing inputs and outputs, for processing digital signals;
logic, operably connected to the embedded core; and
a plurality of characterization cells, operably connected to the logic and the embedded core, wherein at least one characterization cell within the plurality of characterization cells comprises:
    a functional boundary flip-flop that is a last flip-flop sampling output from a clock domain having an input operatively connected to receive functional data and having an output that outputs the functional data;
    a shift flip-flop, operatively connected to a capture flip-flop, having a shift data input connected to a previous characterization cell in a shift register and having a data output to the capture flip-flop,
    wherein the capture flip-flop has data output connected to an input of the functional flip-flop;
    a synchronizer having output connected to the shift enable input of the capture flip-flop; and
    a copy toggle data controller operatively connected to the data input of the capture flip-flop.

* * * * *